US012764988B2

(12) United States Patent
Cheng

(10) Patent No.: US 12,764,988 B2
(45) Date of Patent: Oct. 13, 2026

(54) SEMICONDUCTOR STRUCTURE HAVING A PLURALITY OF HETEROJUNCTION STRUCTURES STACK

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 508 days.

(21) Appl. No.: 18/449,470

(22) Filed: Aug. 14, 2023

(65) Prior Publication Data

US 2024/0063303 A1 Feb. 22, 2024

(30) Foreign Application Priority Data

Aug. 19, 2022 (CN) ......................... 202211001176.X

(51) Int. Cl.
*H10D 30/47* (2025.01)
*H10D 62/85* (2025.01)
*H10D 62/854* (2025.01)

(52) U.S. Cl.
CPC ....... *H10D 30/473* (2025.01); *H10D 30/4755* (2025.01); *H10D 62/8503* (2025.01); *H10D 62/854* (2025.01)

(58) Field of Classification Search
CPC .... H10D 30/47; H10D 30/471; H10D 30/473; H10D 30/4732; H10D 30/474;
(Continued)

(56) References Cited

U.S. PATENT DOCUMENTS

2013/0119347 A1* 5/2013 Cho ..................... H10D 30/024 257/E21.403
2016/0126340 A1 5/2016 Nechay et al.
2020/0411663 A1 12/2020 Saptharishi

FOREIGN PATENT DOCUMENTS

CN 102629624 A 8/2012
CN 111668304 A 9/2020
(Continued)

OTHER PUBLICATIONS

State Intellectual Property Office of the People's Republic of China, Office Action and Search Report Issued in Application No. 202211001176X, Apr. 30, 2025, 14 pages. (Submitted with Machine Translation).

(Continued)

*Primary Examiner* — Cheung Lee
(74) *Attorney, Agent, or Firm* — Carroll, Hoette & Butscher, LLC; Christopher R. Carroll

(57) ABSTRACT

The present disclosure provides a semiconductor structure including a substrate, an insulation layer on the substrate; a protrusion structure protruding out of the insulation layer, where the protrusion structure includes a source region, a drain region and a channel region between whereof; the protrusion structure includes a first through n-th heterojunction structure sequentially stacked along a direction away from the substrate, where n is an integer greater than or equal to 2; the first heterojunction structure includes a first channel layer and a first barrier layer, and the n-th heterojunction structure includes an n-th channel layer and an n-th barrier layer, and at least one of the first barrier layer, through the n-th barrier layer is doped with an N-type element; the source electrode on the source region, the drain electrode on the drain region, and the gate structure on the channel region.

13 Claims, 4 Drawing Sheets

(58) Field of Classification Search
CPC ............. H10D 30/4755; H10D 30/476; H10D 30/477; H10D 30/485; H10D 30/501–509; H10D 30/62; H10D 62/117; H10D 62/124; H10D 62/60; H10D 62/85; H10D 62/8503; H10D 62/854; H10D 62/881; H10D 84/0193; H10D 84/0195
See application file for complete search history.

(56) References Cited

FOREIGN PATENT DOCUMENTS

| | | | |
|---|---|---|---|
| CN | 111668305 | A | 9/2020 |
| CN | 112825329 | A | 5/2021 |
| CN | 113644128 | A | 11/2021 |
| KR | 101465548 | B1 | 11/2014 |

OTHER PUBLICATIONS

State Intellectual Property Office of the People's Republic of China, Office Action and Search Report Issued in Application No. 202211001176X, Oct. 24, 2025, 16 pages. (Submitted with English Translation).

State Intellectual Property Office of the People's Republic of China, Office Action and Search Report Issued in Application No. 202211001176X, Apr. 23, 2026, 17 pages. (Submitted with English Translation).

* cited by examiner

SEMICONDUCTOR STRUCTURE HAVING A PLURALITY OF HETEROJUNCTION STRUCTURES STACK

CROSS REFERENCE TO RELATED APPLICATIONS

This application claims priority to Chinese Patent Application No. 202211001176X entitled "semiconductor structure" filed on Aug. 19, 2022, the entire content of which is incorporated herein by reference.

TECHNICAL FIELD

The present disclosure relates to the field of semiconductor technologies and in particular to a semiconductor structure.

BACKGROUND

Wide-bandgap semiconductor material, such as group III nitrides, as a typical representative of the third-generation semiconductor materials, has excellent properties of wide band gap, high voltage resistance, high temperature resistance, high electron saturation velocity, high drift velocity and easy formation of a high-quality heterojunction structure, which is suitable for manufacturing a high-temperature, high-frequency and high-power electronic device.

In order to further promote the application of heterojunction devices in fields with higher currents and higher frequencies, it is necessary to research multi-channel and multi-heterojunction materials and devices. Compared with the single channel heterojunction structure, the double channel heterojunction structure can have a higher total concentration of 2DEG, which substantially increases the device saturation current. However, the increase in the total barrier layer thickness of the dual channel heterojunction material results in an increase in the distance between the device gate and the underlying channel, which reduces the gate control ability and the peak transconductance of the device. The linear operating characteristics need to be further improved.

In fields such as communication, the linearity of a semiconductor device is an important parameter. However, due to factors such as the decrease in the electron saturation speed and the increase in the device series resistance, the transconductance of the ordinary HEMT (High electron mobility transistor) device will increase with the increase of the gate-source bias voltage, and then decrease after reaching a certain peak value. The decrease of the transconductance can affect the linearity of the device.

SUMMARY

The object of the present disclosure is to provide a semiconductor structure so as to improve the linear working properties of the HEMT devices.

In order to achieve the above purpose, the present disclosure provides a semiconductor structure, which includes:

a substrate;

an insulation layer on the substrate;

a protrusion structure protruding out of the insulation layer, where the protrusion structure includes a source region, a drain region, and a channel region between the source region and the drain region; the protrusion structure includes: a first heterojunction structure, a second heterojunction structure, . . . and an n-th heterojunction structure sequentially stacked along a direction away from the substrate, where n is an integer greater than or equal to 2; the first heterojunction structure includes a first channel layer and a first barrier layer, the second heterojunction structure includes a second channel layer and a second barrier layer, . . . , the n-th heterojunction structure includes an n-th channel layer and an n-th barrier layer, and at least one of the first barrier layer, the second barrier layer, . . . or the n-th barrier layer is/are doped with an N-type element;

a source electrode covered on the source region, a drain electrode covered on the drain region, and a gate structure covered on the channel region.

Optionally, the N-type doped element may include at least one of Si, Ge, Sn, Se or Te.

Optionally, a concentration of the N-type doped element in the first barrier layer is greater than a concentration of the N-type doped element in any one of the second barrier layer, . . . and the n-th barrier layer.

Optionally, the concentration of the N-type doped element in the n-th barrier layer is less than the concentration of the N-type doped element in any one of the first barrier layer, the second barrier layer, . . . and the (n−1)-th barrier layer.

Optionally, a concentrations of the N-type doped element in the first barrier layer, the second barrier layer and the n-th barrier layer gradually decrease layer by layer.

Optionally, a doping manner of the N-type doped element may be uniform doping, gradually changed doping, delta-doping or modulation doping.

Optionally, at least one of the first barrier layer, the second barrier layer, . . . or the n-th barrier layer may include a first N-type ion doped region, a second N-type ion doped region, . . . and an m-th N-type ion doped region sequentially arranged where m is an integer greater than or equal to 2.

Optionally, at least two of the first N-type ion doped region, the second N-type ion doped region, . . . and the m-th N-type ion doped region are connected together and concentrations of the N-type doped element of the two connected N-type ion doped regions may be different.

Optionally, the first N-type ion doped region, the second N-type ion doped region, . . . and the m-th N-type ion doped region are separated.

Optionally, the first N-type ion doped region, the second N-type ion doped region, . . . and the m-th N-type ion doped region are arranged along a gate width direction.

Optionally, the N-type ion doping concentrations of the first N-type ion doped region, the second N-type ion doped region, . . . and the m-th N-type ion doped region gradually increase or decrease from the first N-type ion doped region to the m-th N-type ion doped region.

Optionally, the N-type ion doping concentrations of the first N-type ion doped region, the second N-type ion doped region, . . . and the m-th N-type ion doped region gradually increase or decrease toward a middle from the first N-type ion doped region, and gradually increase or decrease toward the middle from the m-th N-type ion doped region.

Optionally, the semiconductor structure includes a plurality of protrusion structures; the source electrode is covered on a plurality of source regions; the drain electrode is covered on a plurality of drain regions; and the gate structure is covered on a plurality of channel regions.

Optionally, doping concentrations of the N-type doped element in a same barrier layer of the plurality of protrusion structures may be same or different.

Optionally, doping concentrations of the N-type doped element in a same barrier layer of the plurality of protrusion structures may gradually increase or decrease from the protrusion structures at both sides to the protrusion structure in a middle.

Figure 1:
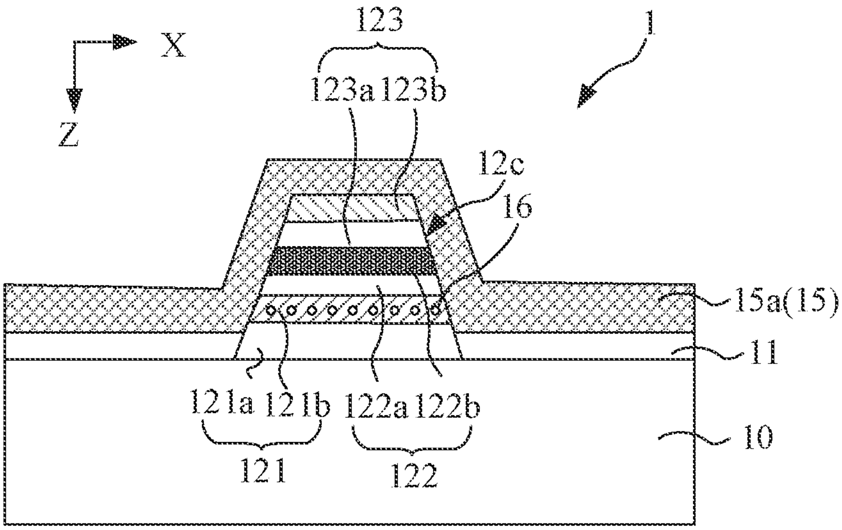
FIG. 1 is a schematic diagram illustrating a sectional structure of a semiconductor structure according to a first embodiment of the present disclosure.

In order to facilitate the understanding of the present disclosure, the reference signs of the drawings are described below:

| | |
|---|---|
| substrate 10 | insulation layer 11 |
| protrusion structure 12 | source region 12a |
| drain region 12b | channel region 12c |
| first heterojunction structure 121 | first channel layer 121a |
| first barrier layer 121b | second heterojunction structure 122 |
| second channel layer 122a | second barrier layer 122b |
| third heterojunction structure 123 | third channel layer 123a |
| third barrier layer 123b | source electrode 13 |
| drain electrode 14 | gate structure 15 |
| gate electrode 15a | gate insulation layer 15b |
| N-type doped element 16 | first N-type ion doped region S1 |
| second N-type ion doped region S2 | m-th N-type ion doped region Sm |
| semiconductor structures 1, 2, 3, 4 and 5 | |

DETAILED DESCRIPTION

In order to make the above objects, features and advantages of the present disclosure clearer and more intelligible, the specific embodiments of the present disclosure will be detailed below in combination with drawings.

Figure 2:
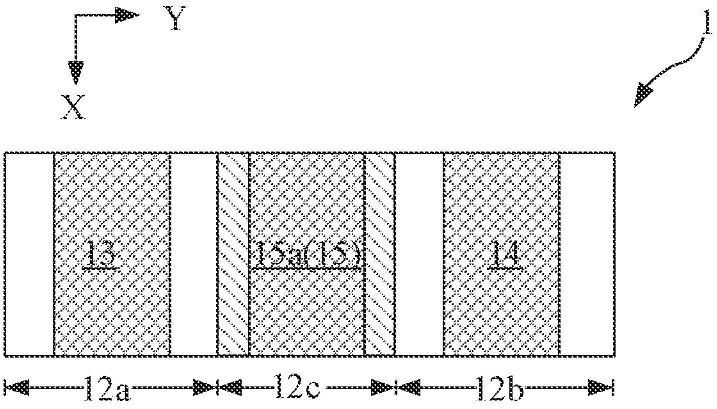
FIG. 2 is a top view of the semiconductor structure in FIG. 1.
Figure 3:
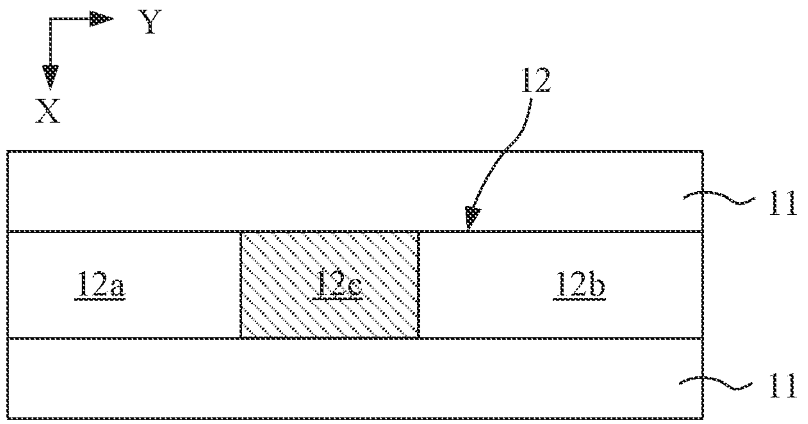
FIG. 3 is a top view of the semiconductor structure without source electrode, drain electrode and gate electrode in FIG. 2.

FIG. 1 is a schematic diagram illustrating a sectional structure of a semiconductor structure according to a first embodiment of the present disclosure. FIG. 2 is a top view of the semiconductor structure in FIG. 1. FIG. 3 is a top view of the semiconductor structure without the source electrode, the drain electrode and the gate electrode in FIG. 2.

With reference to FIGS. 1 to 3, the semiconductor structure 1 includes:

a substrate 10;

an insulation layer 11 located on the substrate 10;

a protrusion structure 12 protruding out of the insulation layer 11, where the protrusion structure 12 includes a source region **12*a*, a drain region 12*b*, and a channel region 12*c* between the source region 12*a* and the drain region 12*b*; the protrusion structure 12 includes: a first heterojunction structure 121, a second heterojunction structure 122 and a third heterojunction structure 123 sequentially stacked along a direction away from the substrate 10; the first heterojunction structure 121 includes a first channel layer 121*a* and a first barrier layer 121*b*, the second heterojunction structure 122 includes a second channel layer 122*a* and a second barrier layer 122*b*, the third heterojunction structure 123 includes a third channel layer 123*a* and a third barrier layer 123*b*, and the first barrier layer 121*b* is doped with an N-type doped element; and a source electrode 13 covered on the source region 12*a*, a drain electrode 14 covered on the drain region 12*b*, and a gate structure 15 covered on the channel region 12*c***.

A material of the substrate 10 may be sapphire, silicon carbide, silicon or diamond or the like.

A material of the insulation layer 11 may be silicon dioxide.

The protrusion structure 12 is connected to the substrate 10. In this embodiment, the semiconductor structure 1 includes one protrusion structure 12.

With reference to FIG. 1, for example, the first heterojunction structure 121 includes the first channel layer **121*a* close to the substrate 10 and the first barrier layer 121*b* away from the substrate 10. A two-dimensional electron gas may be formed in an interface between the first channel layer 121*a* and the first barrier layer 121*b***.

Materials of both the first channel layer **121*a* and the first barrier layer 121*b* may be a GaN-based material and a bandgap width of the first barrier layer 121*b* is greater than a bandgap width of the first channel layer 121*a*. The material of the first barrier layer 121*b* may be AlGaN and the material of the first channel layer 121*a*** may be GaN.

In this embodiment, the gate structure 15 only includes a gate electrode **15*a*. Materials of the gate electrode 15*a*, the source electrode 13 and the drain electrode 14 may be metals, for example, Ti/Al/Ni/Au, Ni/Au and the like. Schottky contact may be formed between the gate electrode 15*a* and the protrusion structure 12, and ohmic contact may be formed between the source electrode 13 and the source region 12*a*, and between the drain electrode 14 and the drain region 12*b***.

In this embodiment, along a direction away from the substrate 10, components/materials of the first channel layer **121*a*, the second channel layer 122*a* and the third channel layer 123*a* are the same, and components/materials of the first barrier layer 121*b*, the second barrier layer 122*b* and third barrier layer 123*b* other than the N-type doped element are also the same. The first barrier layer 121*b* is doped with an N-type doped element 16 and the N-type doped element 16** may include at least one of Si, Ge, Sn, Se or Te. The doping manner of the N-type doped element may be uniform doping, gradual changed doping, delta-doping or modulation doping.

N-type ion doped, for example, Si-doped barrier layer, can change a two-dimensional electron gas (2DEG) concentration of the corresponding region, and further adjust a threshold voltage of the corresponding region. Further, the adjustment effect of the N-type ion doping on the threshold voltage of the region is liable to the doping concentration.

The semiconductor structure 1 in this embodiment can be regarded as parallel connection of the devices with several different transconductance distributions. Each layer of heterojunction structure corresponds to one device. By this parallel connection, mutual compensation for different transconductances of the devices can be achieved. Thus, relative stability of the transconductance value within a large gate-source bias voltage range can be realized, such that the semiconductor structure 1 has good linearity.

The N-type ion doping provides extra current which expands the range for peak value of transconductance and increases the linearity of the transconductance. The N-type ion doping may reduce a contact resistance and increase a source-drain current, but the electric properties such as mobility still remain stable. By using the N-type ions, a large current can be achieved and the resistance of the source-drain region can be lowered.

Furthermore, the semiconductor structure 1 of this embodiment can effectively reduce a sheet resistance and a contact resistance of an epitaxial structure and improve frequency characteristics of the device. Thirdly, the preparation and process adjustment of the semiconductor structure 1 has higher feasibility and repeatability due to a smaller additional effect introduced. The properties such as high breakdown voltage, high output current and the like can be achieved while high linearity is guaranteed.

In other embodiments, the protrusion structure 12 may include: a first heterojunction structure 121, a second heterojunction structure 122, . . . and an n-th heterojunction structure stacked sequentially along a direction away from the substrate 10, where n 2; the first heterojunction structure 121 includes a first channel layer 121*a* and a first barrier layer 121*b*, the second heterojunction structure 122 includes a second channel layer 122*a* and a second barrier layer 122*b*, and the n-th heterojunction structure includes an n-th channel layer and an n-th barrier layer; at least one of the second barrier layer 122*b*, . . . and the n-th barrier layer is doped with the N-type doped element.

Figure 4:
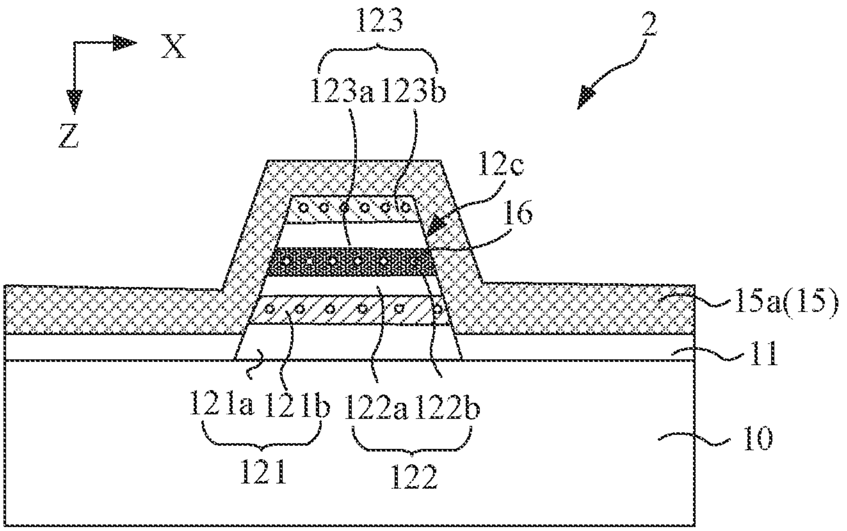
FIG. 4 is a schematic diagram illustrating a sectional structure of a semiconductor structure according to a second embodiment of the present disclosure.

FIG. 4 is a schematic diagram illustrating a sectional structure of a semiconductor structure according to a second embodiment of the present disclosure.

With reference to FIG. 4, the semiconductor structure in the second embodiment is substantially same as the semiconductor structure in the first embodiment except that: in the semiconductor structure 2, the first barrier layer 121*b*, the second barrier layer 122*b* and the third barrier layer 123*b* are all doped with the N-type doped element 16 and further, the concentrations of the N-type doped element 16 in the first barrier layer 121*b*, the second barrier layer 122*b* and the third barrier layer 123*b* gradually decrease from bottom to up.

Since the control capability of the gate electrode for the lower layer of the heterojunction structure is weaker, for the lower layer of the heterojunction structure, the peak value for the transconductance of the device is lowered, and the linear working property is lowered. In this embodiment, the concentrations of the N-type doped element 16 in the multiple barrier layers decrease layer by layer from bottom to up, and therefore, the lower barrier layer doped with the N-type doped element 16 of higher doping concentration has higher 2DEG density, and the device saturation current is significantly increased. For a power application device, the increase of the saturation current is critically important. By adjusting the concentrations of the N-type doped element 16 in different barrier layers, the saturation current of each layer of heterojunction structure can be adjusted and further the peak value for the transconductance of each layer of heterojunction structure is adjusted toward uniformity.

Since the semiconductor structure 2 can be regarded as the parallel connection of the devices with different transconductance distributions, mutual compensation for different transconductances of the devices can be achieved by using this parallel structure, so as to achieve relative stability of the transconductance value within a large gate-source bias voltage range, making the linearity of the semiconductor structure 2 better.

In other embodiments, the concentration of the N-type doped element 16 in the first barrier layer 121*b* may be greater than the concentration of the N-type doped element in any one of the second barrier layer 122*b* and the third barrier layer 123*b*, or the concentration of the N-type doped element 16 in the third barrier layer 123*b* is less than the concentration of the N-type doped element 16 in any one of the first barrier layer 121*b* and the second barrier layer 122*b*.

In other embodiments, the protrusion structure 12 may include: a first heterojunction structure 121, a second heterojunction structure 122, . . . and an n-th heterojunction structure stacked sequentially along a direction away from the substrate 10, where n 2; the first heterojunction structure 121 includes a first channel layer 121*a* and a first barrier layer 121*b*, the second heterojunction structure 122 includes a second channel layer 122*a* and a second barrier layer 122*b*, and the n-th heterojunction structure includes an n-th channel layer and an n-th barrier layer; the concentration of the N-type doped element 16 in the first barrier layer 121*b* is greater than the concentration of the N-type doped element 16 in any one of the second barrier layers, . . . and the n-th barrier layer, or the concentration of the N-type doped element in the n-th barrier layer is less than the concentration of the N-type doped element 16 in any one of the first barrier layer 121*b*, the second barrier layer 122*b*, . . . and the (n−1)-th barrier layer. Specifically, the concentrations of the N-type doped element 16 in the first barrier layer 121*b*, the second barrier layer 122*b*, . . . and the n-th barrier layer gradually decrease.

Figure 5:
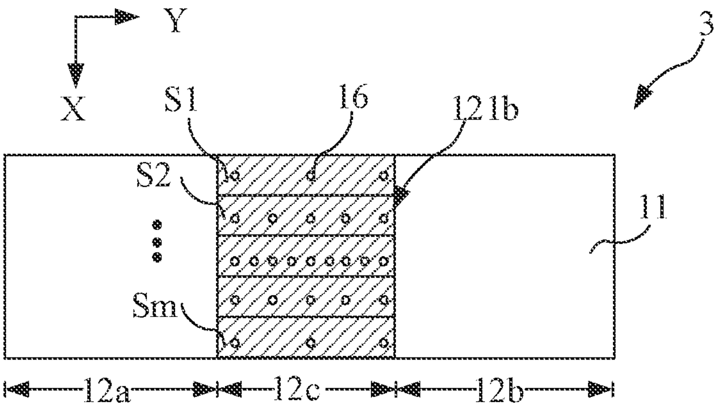
FIG. 5 is a schematic diagram illustrating a sectional structure of a semiconductor structure according to a third embodiment of the present disclosure.

FIG. 5 is a schematic diagram illustrating a sectional structure of a semiconductor structure according to a third embodiment of the present disclosure.

With reference to FIG. 5, the semiconductor structure in the third embodiment is substantially same as the semiconductor structures in the first and second embodiments, except that, in the semiconductor structure 3, the first barrier layer 121*b* includes a first N-type ion doped region S1, a second N-type ion doped region S2, . . . and the m-th N-type ion doped region Sm sequentially arranged, where m is a positive integer and m≥2. The first N-type ion doped region S1, the second N-type ion doped region S2, . . . and the m-th N-type ion doped region Sm are arranged along a gate width direction (i.e., X-axis), and the N-type ion doping concentrations of the first N-type ion doped region S1, the second N-type ion doped region S2, . . . and the m-th N-type ion doped region Sm increase from both ends toward a middle.

Along the gate width direction, the first N-type ion doped region S1, the second N-type ion doped region S2, . . . and the m-th N-type ion doped region Sm may be equal or unequal in size.

In this embodiment, as shown in FIG. 5, two adjacent N-type ion doped regions of all of the first N-type ion doped region S1, the second N-type ion doped region S2, . . . and the m-th N-type ion doped region Sm are connected together. In other embodiments, two adjacent N-type ion doped regions of some of the first N-type ion doped region S1, the second N-type ion doped region S2, . . . and the m-th N-type ion doped region Sm are connected together and two adjacent N-type ion doped regions of some of the first N-type ion doped region S1, the second N-type ion doped region S2, . . . and the m-th N-type ion doped region Sm are separated from each other; or two adjacent N-type ion doped regions of all of the first N-type ion doped region S1, the second N-type ion doped region S2, . . . and the m-th N-type ion doped region Sm are separated from each other. When two adjacent N-type ion doped regions of all of the first N-type ion doped region S1, the second N-type ion doped region S2, . . . and the m-th N-type ion doped region Sm are separated from each other, the concentrations of the N-type doped element of the first N-type ion doped region S1, the second N-type ion doped region S2, . . . and the m-th N-type ion doped region Sm may be same or different.

By mutual compensation of transconductances of a series of N-type ion doped regions in the barrier layer, stability of the transconductances can be achieved in a large gate-source bias voltage range, so as to increase the linearity of the semiconductor structure 3. Compared with the existing manner, in this method, it is not required to start from the physical mechanism of the transconductance properties of the devices but perform mutual compensation by using the devices of different transconductance properties, avoiding numerous adjustments for the devices and material structures and reducing the design difficulty without weakening the linearity effect.

In other embodiments, at least one of the second barrier layer 122*b*, . . . or the n-th barrier layer may include a first N-type ion doped region S1, a second N-type ion doped region S2, . . . and an m-th N-type ion doped region Sm sequentially arranged where m is a positive integer and m 2. Two adjacent N-type ion doped regions of some of the first N-type ion doped region S1, the second N-type ion doped region S2, . . . and the m-th N-type ion doped region Sm may be connected together; or two adjacent N-type ion doped regions of some of the first N-type ion doped region S1, the second N-type ion doped region S2, . . . and the m-th N-type ion doped region Sm are connected together and two adjacent N-type ion doped regions of some of the first N-type ion doped region S1, the second N-type ion doped region S2, . . . and the m-th N-type ion doped region Sm are separated from each other; or two adjacent N-type ion doped regions of all of the first N-type ion doped region S1, the second N-type ion doped region S2, . . . and the m-th N-type ion doped region Sm are separated from each other. When two adjacent N-type ion doped regions of all of the first N-type ion doped region S1, the second N-type ion doped region S2, . . . and the m-th N-type ion doped region Sm are separated from each other, the concentrations of the N-type doped element of the first N-type ion doped region S1, the second N-type ion doped region S2, . . . and the m-th N-type ion doped region Sm may be same or different.

The distribution manners, the numbers and the doping concentrations of a series of N-type ion doped regions of different barrier layers may be different.

In other embodiments, the arrangement of the first N-type ion doped region S1, the second N-type ion doped region S2, . . . and the m-th N-type ion doped region Sm of each barrier layer may form, with the gate width direction, an included angle, for example, an acute angle or right angle.

The N-type ion doping concentrations of the first N-type ion doped region S1, the second N-type ion doped region S2, . . . and the m-th N-type ion doped region Sm may increase or decrease from the first N-type ion doped region S1 to the m-th N-type ion doped region Sm; or, the N-type ion doping concentrations of the first N-type ion doped region S1, the second N-type ion doped region S2, . . . and the m-th N-type ion doped region Sm may decrease to a middle from both ends, i.e. the first N-type ion doped region S1 and the m-th N-type ion doped region Sm.

Figure 6:
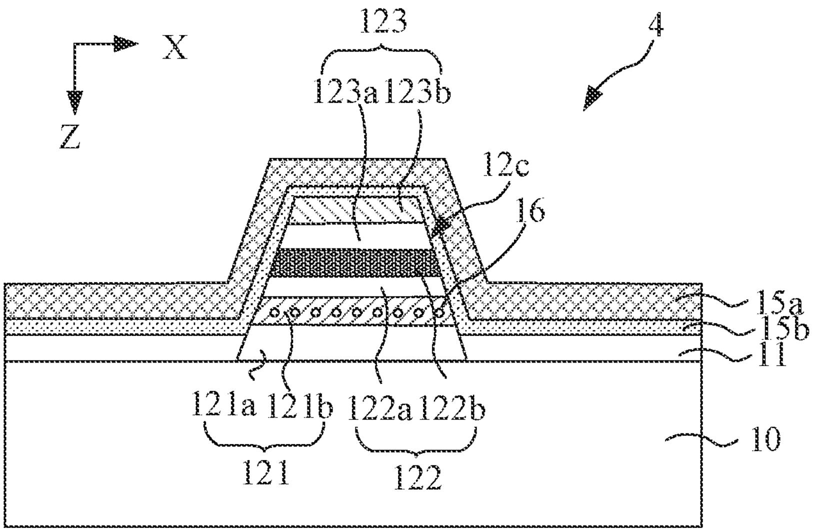
FIG. 6 is a schematic diagram illustrating a sectional structure of a semiconductor structure according to a fourth embodiment of the present disclosure.

FIG. 6 is a schematic diagram illustrating a sectional structure of a semiconductor structure according to a fourth embodiment of the present disclosure.

With reference to FIG. 6, the semiconductor structure in the fourth embodiment is substantially same as the semiconductor structures in the first to third embodiments except that: in the semiconductor structure 4, the gate structure 15 includes a gate insulation layer 15*b* and a gate electrode 15*a*.

In other words, the semiconductor structure 4 is an MIS HEMT transistor.

A material of the gate insulation layer 15*b* may be silicon dioxide, or hafnium dioxide or the like.

Figure 7:
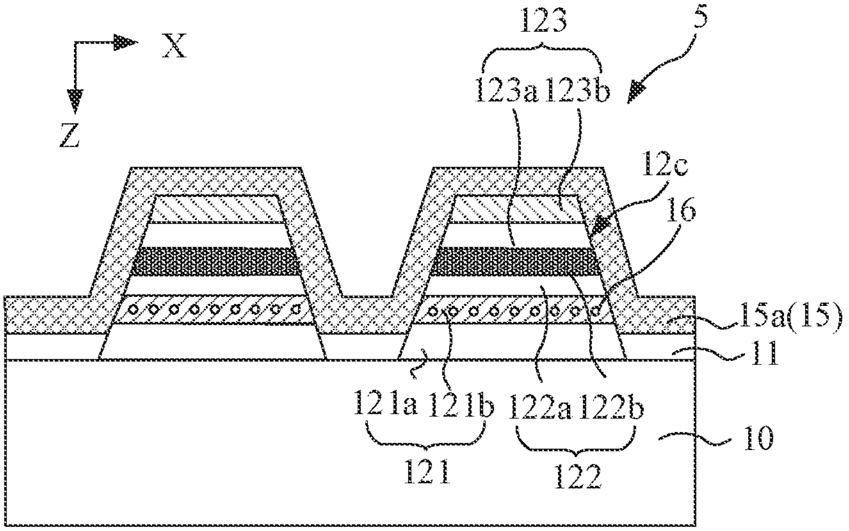
FIG. 7 is a schematic diagram illustrating a sectional structure of a semiconductor structure according to a fifth embodiment of the present disclosure.

FIG. 7 is a schematic diagram illustrating a sectional structure of a semiconductor structure according to a fifth embodiment of the present disclosure.

With reference to FIG. 7, the semiconductor structure in the fifth embodiment is substantially same as the semiconductor structures in the first to fourth embodiments except that: in the semiconductor structure 5, there are a plurality of protrusion structures 12; the source electrode 13 is covered on a plurality of source regions 12*a*; the drain electrode 14 is covered on a plurality of drain regions 12*b*; and the gate structure 15 is covered on a plurality of channel regions 12*c*.

Compared with one channel region 12*c*, a plurality of channel regions 12*c* can form a plurality of channels connected in parallel between the source electrode 13 and the drain electrode 14, which reduces a conduction resistance of the semiconductor structure 5.

A plurality of protrusion structures 12 are connected between the source electrode 13 and the drain electrode 14 to increase the breakdown voltage and improve the dynamic properties. A plurality of protrusion structures 12 can also increase a gate control area, increase the gate control capability, increase the carrier density as well as maintaining the stability of the semiconductor mobility, and reduce the sheet resistance, and thus the frequency characteristics of the semiconductor structure 5 can be obviously improved.

Furthermore, the doping concentrations of the N-type doped element in a same barrier layer of a plurality of protrusion structures 12 may be same or different, namely, the doping concentrations of the N-type doped element in the first barrier layer 121*b* of a plurality of protrusion structures 12 may be same or different, the doping concentrations of the N-type doped element in the second barrier layer 122*b* of a plurality of protrusion structures 12 may be same or different, . . . and the doping concentrations of the N-type doped element in the n-th barrier layer of a plurality of protrusion structures 12 may be same or different.

The doping concentrations of the N-type doped element in a same barrier layer of a plurality of protrusion structures 12 may gradually increase or decrease from the protrusion structures 12 at both sides to the protrusion structure 12 in the middle. In other words, the doping concentrations of the N-type doped element in the first barrier layer 121*b* of a plurality of protrusion structures 12 may gradually increase or decrease from the protrusion structures 12 at both sides to the protrusion structure 12 in the middle, the doping concentrations of the N-type doped element in the second barrier layer 122*b* of a plurality of protrusion structures 12 may gradually increase or decrease from the protrusion structures 12 at both sides to the protrusion structure 12 in the middle, . . . and the doping concentrations of the N-type doped element in the n-th barrier layer of a plurality of protrusion structures 12 may gradually increase or decrease from the protrusion structures 12 at both sides to the protrusion structure 12 in the middle. For example, a first protrusion structure, a second protrusion structure, . . . and the x-th (i.e., x is an odd number) protrusion structure are sequentially arranged along the X-axis, the doping concentrations of the N-type doped element in the second barrier layer 122*b* of a plurality of protrusion structures 12 may gradually increase or decrease from the first protrusion structure to the (x+1)/2-th protrusion structure and from the x-th protrusion structure to the (x+1)/2-th protrusion structure.

Although the present disclosure is described above, the present disclosure is not limited hereto. Those skilled in the art can make various changes and modifications without departing from the spirit and scope of the present disclosure. Therefore, the scope of protection of the present disclosure should be indicated by the scope of the claims.

Compared with the prior arts, the present disclosure has the following beneficial effects.

Compared with the planar HEMT device, the semiconductor structure provided by the disclosure utilizes a gate electrode to control a channel on three surfaces to increase the control capability of the gate electrode for the channel. In the present disclosure, the N-type ion doped, for example, Si-doped barrier layer can change the 2DEG concentration of the corresponding region, and further adjust the threshold voltage of the corresponding region; further, the adjustment effect of the N-type ion doping for the threshold voltage of the region is liable to the doping concentration. The N-type ion doping can provide extra current to expand a range of the peak value for transconductance and increase a linearity of the transconductance.

The N-type ion doping may reduce a contact resistance and increase a source-drain current, and the electric properties such as mobility still remain stable. By using the N-type ions, a large current can be achieved, and the resistance of the source-drain region can be lowered.

By mutual compensation of transconductances of a series of N-type ion doped regions in the barrier layer, stability of the transconductances can be achieved in a large gate-source bias voltage range so as to increase the linearity of the devices. Compared with the existing manner, in this method, it is not required to start from the physical mechanism of the transconductance properties of the devices but perform mutual compensation by using the devices of different transconductance properties, avoiding numerous adjustments for the devices and material structures and reducing the design difficulty without weakening the linearity effect.

A plurality of protrusion structures are connected between the source electrode and the drain electrode to increase the breakdown voltage and improve the dynamic properties. A plurality of protrusion structures can also increase a gate control area, increase the gate control capability, increase the carrier density as well as maintaining the stability of the semiconductor mobility and reduce the sheet resistance, and thus the frequency characteristics of the device can be obviously improved.

What is claimed is:

1. A semiconductor structure, comprising:

a substrate;

an insulation layer on the substrate;

a protrusion structure protruding out of the insulation layer, wherein the protrusion structure comprises a source region, a drain region, and a channel region between the source region and the drain region; the protrusion structure comprises: a first heterojunction structure, a second through an n-th heterojunction structure sequentially stacked along a direction away from the substrate, wherein n is an integer greater than or equal to 2; the first heterojunction structure comprises a first channel layer and a first barrier layer, the second heterojunction structure comprises a second channel layer and a second barrier layer, and the n-th heterojunction structure comprises an n-th channel layer and an n-th barrier layer, and at least one of the first barrier layer through the n-th barrier layer is doped with an N-type element;

a source electrode covered on the source region;

a drain electrode covered on the drain region; and a gate structure covered on the channel region;

wherein at least one of the first barrier layer, the second barrier layer, through the n-th barrier layer comprises a first N-type ion doped region, a second N-type ion doped region, through an m-th N-type ion doped region which are sequentially arranged, wherein m is an integer greater than or equal to 2.

2. The semiconductor structure of claim 1, wherein the N-type element comprises at least one of Si, Ge, Sn, Se or Te.

3. The semiconductor structure of claim 1, wherein a concentration of the N-type element in the first barrier layer is greater than a concentration of the N-type element in any one of the second barrier layer through the n-th barrier layer;

or a concentration of the N-type element in the n-th barrier layer is less than the concentration of the N-type element in any one of the first barrier layer, the second barrier layer through an (n−1)-th barrier layer.

4. The semiconductor structure of claim 3, wherein the concentrations of the N-type element in the first barrier layer, the second barrier layer and the n-th barrier layer gradually decrease layer by layer.

5. The semiconductor structure of claim 1, wherein a doping manner of the N-type element is uniform doping, gradually changed doping, delta-doping or modulation doping.

6. The semiconductor structure of claim 1, wherein at least two of the first N-type ion doped region, the second N-type ion doped region, through the m-th N-type ion doped region are connected together and concentrations of the N-type element of the at least two of the first N-type ion doped regions, the second N-type ion doped region through the m-th N-type ion doped region that are connected together are different.

7. The semiconductor structure of claim 1, wherein the first N-type ion doped region, the second N-type ion doped region, through the m-th N-type ion doped region are separated.

8. The semiconductor structure of claim 1, wherein the first N-type ion doped region, the second N-type ion doped region, through the m-th N-type ion doped region are arranged along a gate width direction.

9. The semiconductor structure of claim 1, wherein N-type ion doping concentrations of the first N-type ion doped region, the second N-type ion doped region, through the m-th N-type ion doped region gradually increase or decrease from the first N-type ion doped region to the m-th N-type ion doped region.

10. The semiconductor structure of claim 1, wherein N-type ion doping concentrations of the first N-type ion doped region, the second N-type ion doped region, through the m-th N-type ion doped region gradually increase or decrease toward a middle from the first N-type ion doped region, and gradually increase or decrease toward the middle from the m-th N-type ion doped region.

11. The semiconductor structure of claim 1, further comprising: a plurality of protrusion structures; the source electrode is covered on a plurality of source regions; the drain electrode is covered on a plurality of drain regions;

and the gate structure is covered on a plurality of channel regions.

12. The semiconductor structure of claim 11, wherein doping concentrations of the N-type element in a same barrier layer of the plurality of protrusion structures are same or different.

13. The semiconductor structure of claim 11, wherein doping concentrations of the N-type element in a same barrier layer of the plurality of protrusion structures gradually increase or decrease from the protrusion structures at both sides to the protrusion structure in a middle.

* * * * *